(12) United States Patent
Joo et al.

(10) Patent No.: US 6,278,130 B1
(45) Date of Patent: Aug. 21, 2001

(54) LIQUID CRYSTAL DISPLAY AND FABRICATING METHOD THEREOF

(76) Inventors: Seung-Ki Joo, 22-201, Sampoong Apt., 1685, Seocho-dong, Seocho-ku, Seoul; Tae-Hyung Ihn, 44-64, Sadang-dong, Dongiak, Seoul, both of (KR)

( * ) Notice: Subject to any disclaimer, the term of this patent is extended or adjusted under 35 U.S.C. 154(b) by 0 days.

(21) Appl. No.: 09/453,172

(22) Filed: Dec. 2, 1999

Related U.S. Application Data

(63) Continuation-in-part of application No. 09/074,606, filed on May 8, 1998.

(51) Int. Cl.[7] .................................................. H01L 29/04
(52) U.S. Cl. ................................ 257/59; 257/72; 349/41; 349/42
(58) Field of Search ............................. 257/59, 72, 350, 257/351, 344, 408; 349/41, 42, 43

(56) References Cited

U.S. PATENT DOCUMENTS

| | | | |
|---|---|---|---|
| 5,937,315 | * | 8/1999 | Xiang et al. .................. 438/486 |
| 5,940,693 | * | 8/1999 | Maekawa ....................... 438/166 |
| 6,066,547 | * | 5/2000 | Maekawa ....................... 438/486 |

FOREIGN PATENT DOCUMENTS

408078689 * 3/1996 (JP).

* cited by examiner

*Primary Examiner*—Nathan Flynn
*Assistant Examiner*—Remmon R. Fordé
(74) *Attorney, Agent, or Firm*—Long Aldridge & Norman

(57) ABSTRACT

An LCD includes a substrate; a first transistor formed on the substrate, the first transistor having a MILC (metal-induced lateral crystallization) region formed on a substrate with a semiconductor material and including a channel region; and MIC (metal-induced crystallization) regions formed on sides of the MILC region with a semiconductor material, wherein at least one boundary between the MILC region and one of the MIC regions is located outside the channel region; a second transistor formed on the substrate, the second transistor having a MILC (metal-induced lateral crystallization) region formed on the same substrate with a semiconductor material and including a channel region; and MIC (metal-induced crystallization) regions formed on sides of the MILC region with a semiconductor material, wherein at least one boundary between the MILC region and one of the MIC regions is located outside the channel region; and a third transistor formed on the substrate, the third transistor having an amorphous silicon layer in an active layer.

18 Claims, 15 Drawing Sheets

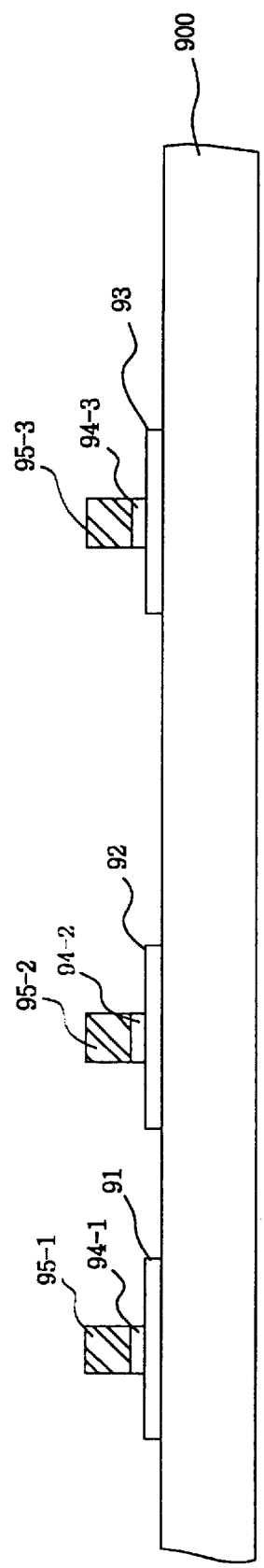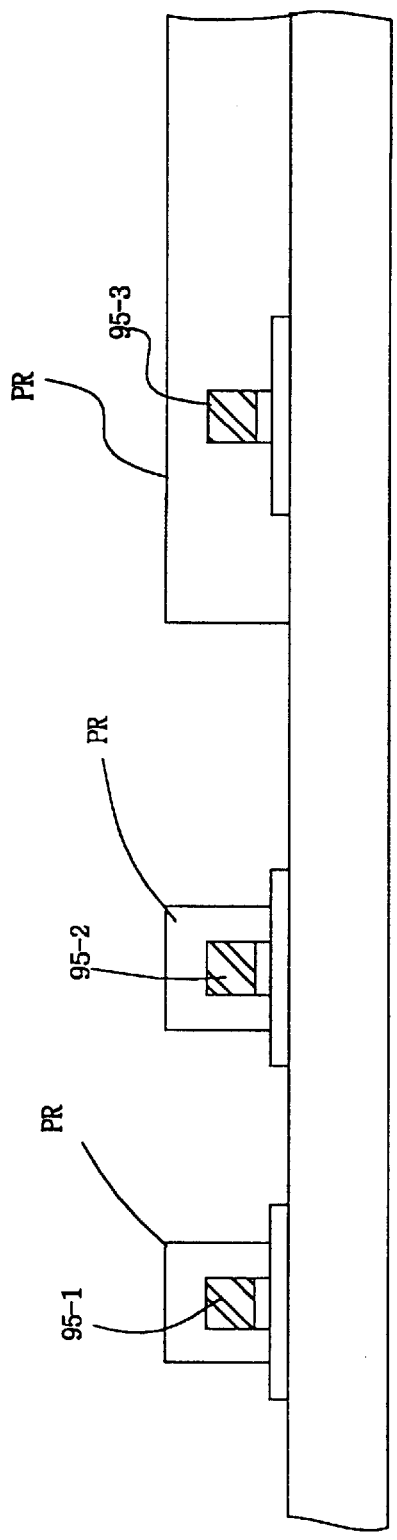

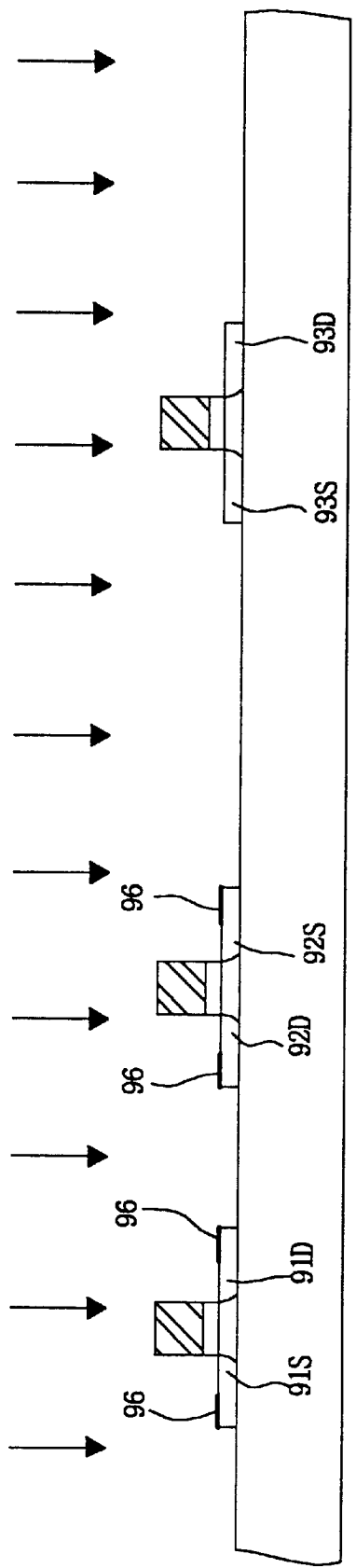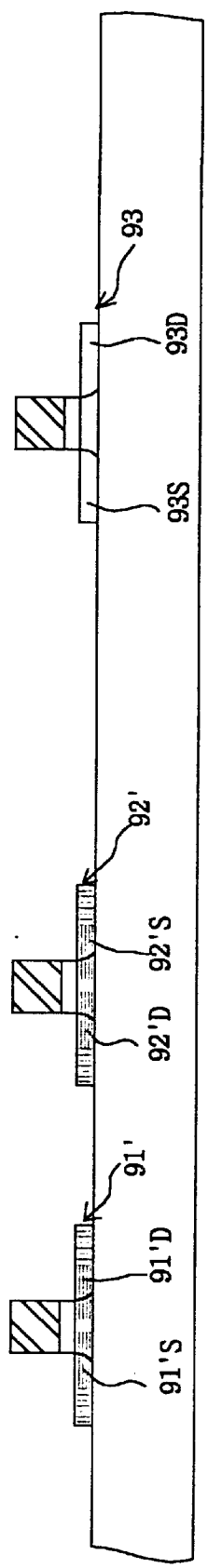

LIQUID CRYSTAL DISPLAY AND FABRICATING METHOD THEREOF

This is a continuation-in-part of pending prior application Ser. No. 09/074,606 filed on May 8, 1998, which is incorporated herein by reference.

BACKGROUND OF THE INVENTION

1. Field of the Invention

The present invention relates to a thin film transistor (TFT) and a method of fabricating the same and more particularly, to a TFT and its fabricating method having Metal Induced Crystallization (MIC) region crystallized by an MIC process and a Metal Induced Lateral Crystallization (MILC) region crystallized by an MILC process wherein the boundary between the MIC and MILC regions is located outside a channel region of the TFT.

2. Discussion of Related Art

A method of crystallizing amorphous silicon using heat treatment at a low temperature after a certain kind of a metal layer has been deposited on the amorphous silicon is known as an MIC process. The MIC process is beneficial due to the low temperature crystallization of amorphous silicon. However, the MIC process has not been applied to electronic devices because of an inflow of metal into the thin film of crystallized silicon formed underneath the metal layer, which causes the intrinsic characteristics of amorphous silicon to deteriorate.

A different method of crystallizing amorphous silicon by MILC has been proposed to address this problem. FIGS. 1A–1D show examples of schematic cross-sectional views for explaining an MILC process.

Referring to FIG. 1A, an amorphous silicon layer 11 to be crystallized is formed to a thickness of 1000 Å on an insulating layer (not shown). Metal patterns, such as nickel patterns 13, are formed on the amorphous silicon layer 11.

Referring to FIG. 1B, the amorphous silicon layer 11 is crystallized by cooling-down the layer II after heat is applied to the nickel patterns 13 at a temperature of 350–500° C. On the regions "A" of the amorphous silicon layer 11 having the nickel patterns 13 thereon, nickel silicide 14 is formed as the nickel in the nickel patterns 13 reacts with the amorphous silicon in the layer 11. The nickel silicide 14 becomes a seed for crystallization and promotes the crystallization of the amorphous silicon layer 11. The "A" regions crystallized directly by the nickel silicide 14 become the MIC regions.

Referring to FIG. 1C, the boundaries of the "A" regions having crystallized silicon function as a new seed for crystallization and cause lateral crystallization of silicon in the region "B". Since the region "B" has no seed of crystallization and has not been solidified yet, the lateral crystallization of silicon is performed by the MIC regions, which have been completely crystallized. That is, the region "B" becomes the MILC region as the crystallization by the nickel silicide 14 is induced in the lateral direction of the MIC region.

FIG. 1D shows a cross-sectional view of a crystallized silicon layer having MIC and MILC regions. Generally, the MILC regions have less metal contamination, superior crystals and less coarseness in the crystallized surface thereof, than the MIC regions. Thus, the MILC regions are more suitable to function as channel regions for FIGS. 2A to 2D show a method of fabricating a channel region of a thin film transistor using an MILC process according to a related art.

Referring to FIG. 2A, an amorphous silicon layer as an active layer 21 is deposited on an insulation substrate 20 having a buffer film (not shown) on its upper part, and the active layer 21 is patterned by photolithography and etching. A gate insulation layer 22 and a gate electrode 23 are formed on the active layer 21 by conventional processes.

Referring to FIG. 2B, a nickel layer 24 is formed to a thickness of 20 Å by sputtering nickel on the entire surface of the formed structure. Then a source region 21S and a drain region 21D are formed at portions of the active layer 21 by heavily doping the entire surface of the formed structure with impurities. Between the source and drain regions 21S and 21D, a channel region 21C is formed on the substrate 20.

Referring to FIG. 2C, amorphous silicon in the active layer 21 is crystallized by heating the panel 20 at a temperature of 350–500° C. Then the source and drain regions 21S and 21D on which the nickel layer 24 has been formed become the MIC regions having silicon crystallized by an MIC process. The channel region 21C without the nickel layer 24 formed directly thereon, becomes the MILC region where silicon has been crystallized by an MILC process. Impurities are activated in the source and drain regions 21S and 21D during the heat treatment as amorphous silicon is crystallized in the active layer 21.

In the thin film transistor fabricated by the above-described method according to the conventional art, the channel region 21C has boundaries defined by the crystalline structure of silicon in the MIC regions facing that of silicon in the adjacent MILC region. Since the boundary between the MIC region and the MILC region is located at the junction where the source or drain region meets the channel region, an abrupt difference in the crystal structure appears in the junction and the metal from the MIC region contaminates the adjacent MILC region. Consequently, a trap is formed at such junctions as soon as the TFT is turned on which causes unstable channel regions and deteriorates the characteristics of the thin film transistor.

SUMMARY OF THE INVENTION

Accordingly, the present invention is directed to a thin film transistor and its fabricating method that substantially obviate one or more of the problems due to limitations and disadvantages of the related art.

Additional features and advantages of the invention will be set forth in the description, which follows and in part will be apparent from the description, or may be learned by practice of the invention. The objectives and other advantages of the invention will be realized and attained by the structure particularly pointed out in the written description and claims hereof as well as the appended drawings.

To achieve the above-noted and other advantages and in accordance with the purposes of the present invention, as embodied and broadly described, a transistor includes an MILC (metal-induced lateral crystallization) region formed on a substrate with a semiconductor material and including a channel region; and a plurality of MIC (metal-induced crystallization) regions formed on the sides of the MILC region with a semiconductor material, wherein at least one boundary between the MILC region and one of the MIC regions is located outside the channel region.

In another aspect of the present invention, a method of fabricating a transistor comprises the steps of forming an active layer on a substrate; forming a gate electrode on a portion of the active layer; forming source and drain regions in the active layer using the gate electrode as a mask; forming a metal layer on portions of the active layer, excluding portions of the active layer adjacent the gate electrode; and crystallizing the active layer.

In another aspect of the present invention, a method of fabricating a transistor comprises the steps of forming an active layer on a portion of a substrate; forming a gate electrode on a portion of the active layer; forming a metal layer on the active layer excluding portions of the active layer adjacent the gate electrode; forming a source and drain region in the active layer under the metal layer; and crystallizing the active layer.

In another aspect of the present invention, a method of fabricating a transistor comprises the steps of forming an MILC (metal-induced lateral crystallization) region on a substrate using a semiconductor material, the MILC region including a channel region; and forming a plurality of MIC (metal-induced crystallization) regions formed on sides of the MILC region using a semiconductor material, wherein at least one boundary between the MILC region and one of the MIC regions is located outside the channel region.

In another aspect of the present invention, an LCD comprises a substrate; a first transistor formed on the substrate, the first transistor having an MILC (metal-induced lateral crystallization) region formed on a substrate with a semiconductor material and including a channel region; and MIC (metal-induced crystallization) regions formed on sides of the MILC region with a semiconductor material, wherein at least one boundary between the MILC region and one of the MIC regions is located outside the channel region; a second transistor formed on the substrate, the second transistor having an MILC (metal-induced lateral crystallization) region formed on the same substrate with a semiconductor material and including a channel region; and MIC (metal-induced crystallization) regions formed on sides of the MILC region with a semiconductor material, wherein at least one boundary between the MILC region and one of the MIC regions is located outside the channel region; and a third transistor formed on the substrate, the third transistor having an amorphous silicon layer in an active layer.

In another aspect of the present invention, a method of fabricating an LCD having a first and a second transistors for driving circuit and a third transistor for pixel array on a substrate comprises the steps of forming each active layer of the first, the second and the third transistors on the substrate; forming each gate insulating layer and each gate electrode on each active layer of the first, the second and the third transistors, respectively; forming a metal layer on portions of each active layer of the first and the second transistors, excluding portions of each active layer adjacent each gate electrode of the first and the second transistors; forming each source and drain regions of the first, second and the third transistors using each gate electrode of the first, the second and the third transistors as a mask for doping process; and crystallizing each active layer of the first and the second transistors.

In a further aspect of the present invention, a method of fabricating an LCD having a first and a second transistors for driving circuit and a third transistor for pixel array on a substrate comprises the steps of forming each active layer of the first, the second and the third transistors on the substrate; forming each gate insulating layer and each gate electrode on each active layer of the first, the second and the third transistors, respectively; forming each source and drain regions of the first, second and the third transistors using each gate electrode of the first, the second and the third transistors as a mask for doping process; forming a metal layer on portions of each active layer of the first and the second transistors, excluding portions of each active layer adjacent each gate electrode of the first and the second transistors; and crystallizing each active layer of the first and the second transistors.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention, wherein:

FIGS. 9A–9G show a method of fabricating MILC TFTs and an amorphous silicon TFT according to a fifth embodiment of the present invention.

DETAILED DESCRIPTION OF PREFERRED EMBODIMENTS

Reference will now be made in detail to the preferred embodiments of the present invention, examples of which are illustrated in the accompanying drawings.

FIGS. 3A–3E show a method of fabricating an MILC TFT (metal induced lateral crystallization TFT) according to the first embodiment of the present invention.

Figure 1A:
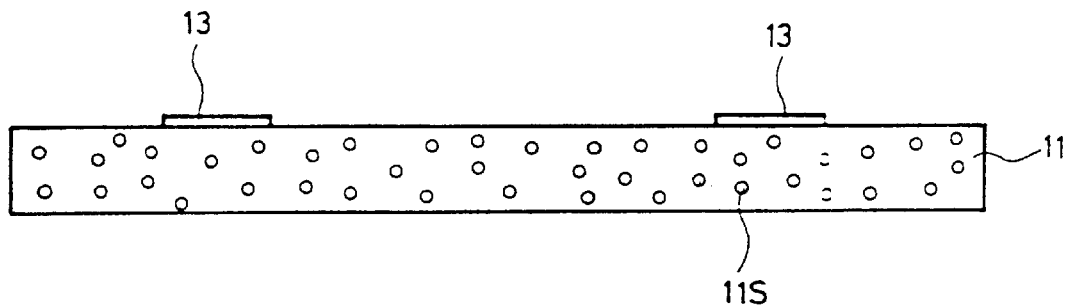
FIGS. 1A–1D show crystallization of a silicon layer by MIC and MILC processes.
Figure 1B:
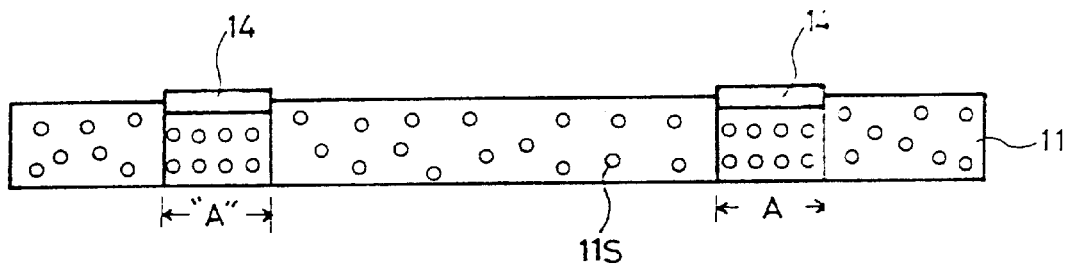
Figure 1C:
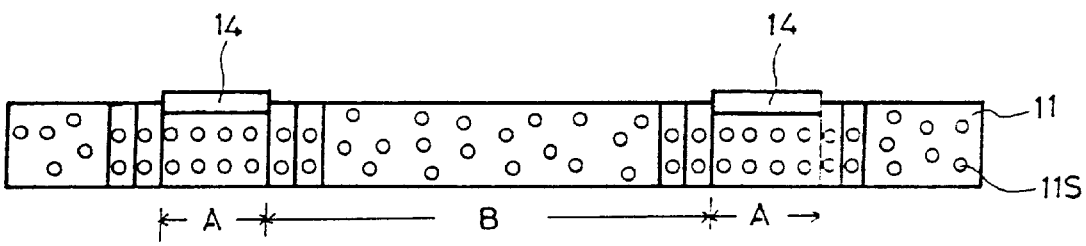
Figure 1D:
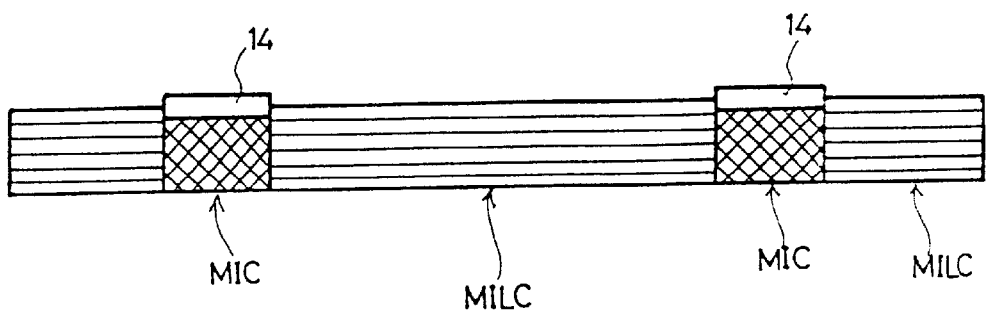
Figure 2A:
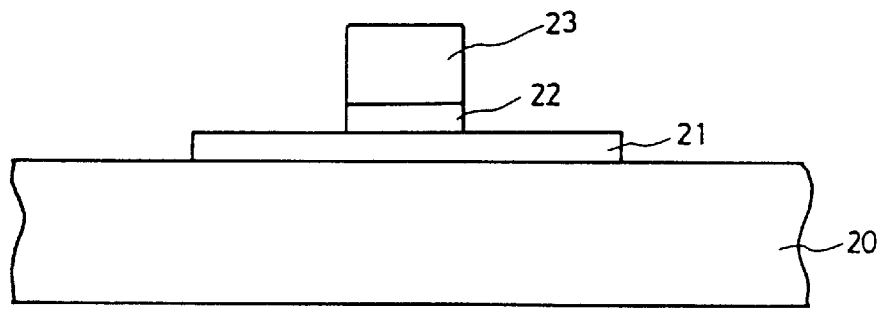
FIGS. 2A–2C show a method of fabricating an MILC TFT according to a related art.
Figure 2B:
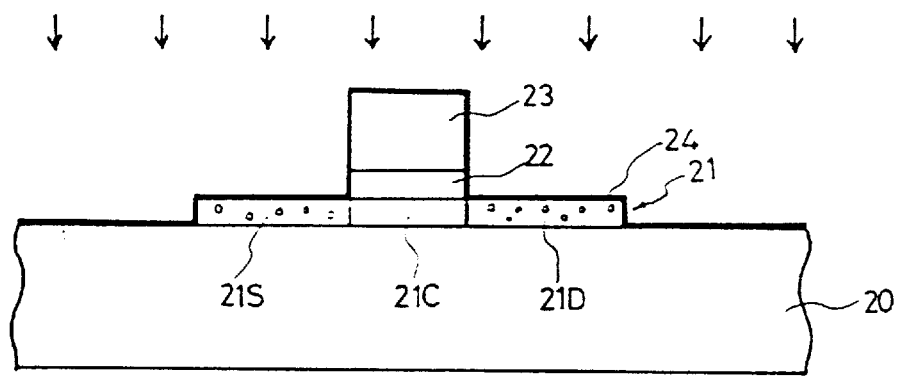
Figure 2C:
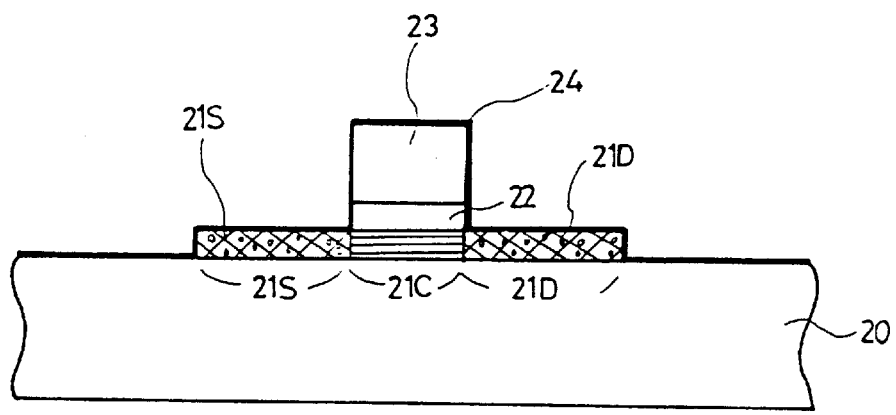
Figure 3A:
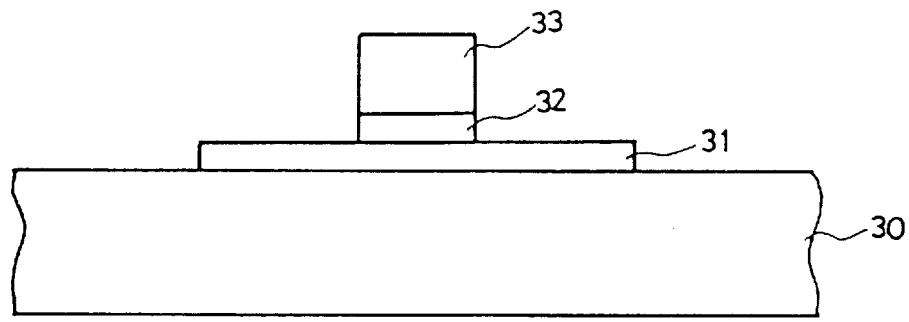
FIGS. 3A–3E show a method of fabricating an MILC TFT according to a first embodiment of the present invention.

Referring to FIG. 3A, an amorphous silicon layer as an active layer 31 is formed on an insulation substrate 30 having a buffer film (not shown) thereon. The active layer 31 is deposited by LPCVD (Low Pressure Chemical Vapor Deposition) with a thickness of about 1000 Å and patterned by photolithography. Then, an insulating layer, such as a gate insulating layer 32, is formed to a thickness of about 1000 Å by ECR-PECVD (Electron Cyclotron Resonance—Plasma Enhanced Chemical Vapor Deposition). A metal layer for forming a gate electrode 33 is deposited on the gate insulating layer 32 to a thickness of about 2000 Å by sputtering. The metal layer is patterned by using photolithography to form the gate insulating layer 32. The gate electrode 33 is used as an etch mask to etch the insulating layer 32.

Figure 3B:
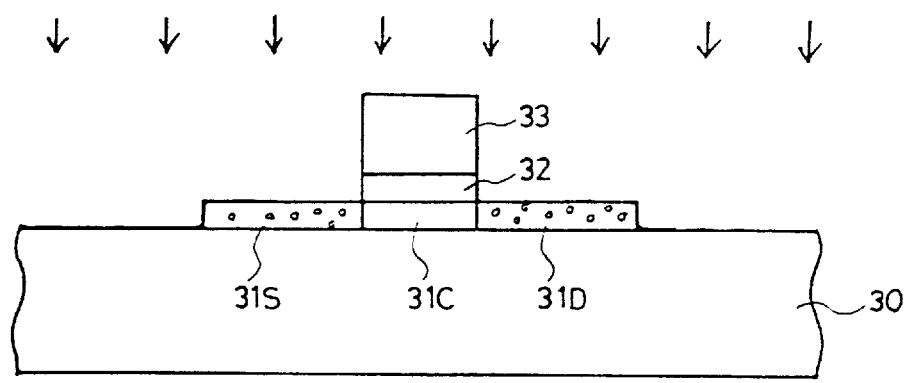

Referring to FIG. 3B, source and drain regions 31S and 31D are formed in portions of the active layer 31 by doping heavily the entire surface of the substrate 30 with impurities, wherein the gate insulating layer 32 and/or the gate electrode 33 function as a doping mask.

Figure 3C:
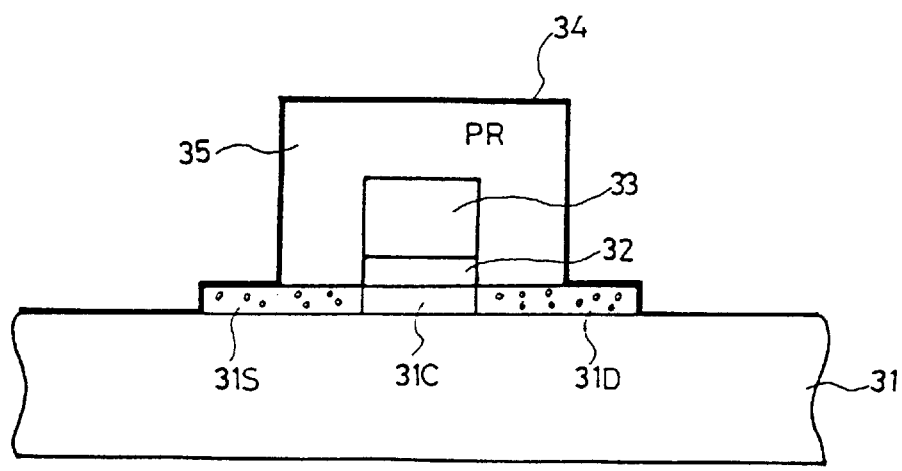

Referring to FIG. 3C, the entire surface of the formed structure is coated with a photoresist PR. A photoresist pattern 35 having a length that is about 2 μm longer than the gate electrode length, is defined by patterning the photoresist PR with a photo process. Although the language "length" has been and will be used to describe a size dimension of a photoresist pattern and gate electrode, it is contemplated that other descriptions, such as "width", can be used to describe the same. That is, it is mainly desirable to describe that the photoresist pattern 35 extends in a horizontal direction 2 μm more than the gate electrode as shown in FIG. 3C. Then a metal layer, such as a nickel layer 34, having a thickness of 10 to 200 Å is formed by sputtering nickel on the formed structure. Here and other embodiments described below, nickel can be substituted with one of Pd, Ti, Ag, Au, Al, Sb, Cu, Co, Cr, Mo, Ti, Ir, Ru, Rh, Cd, Pt, etc, and their mixture.

Figure 3D:
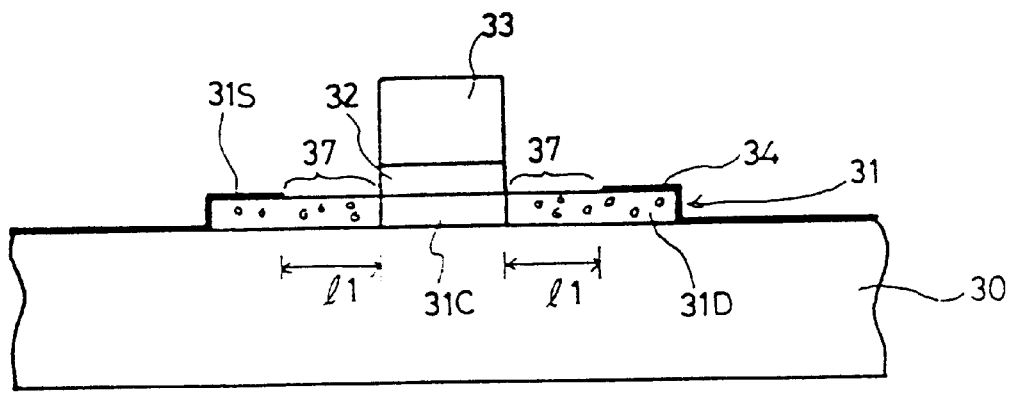

Referring to FIG. 3D, the photoresist pattern 35 is removed by a LIFT-OFF process such that the nickel layer 34 coated directly on the photoresist pattern 35 is removed to form nickel off-set regions 37 where portions of the active layer are without the nickel layer 34. As a result of the LIFT-OFF process, the length "$l_1$" of each nickel off-set region 37 equals to preferably about 0.01 to 5 μm since the photoresist pattern 35 is longer (or wider) than the gate electrode 33 by preferably about 0.02 to 10 μm.

In a conventional method including steps of depositing metal and patterning the deposited metal by photolithography, it is difficult to completely remove the metal since the metal starts to react with amorphous silicon as soon as it is deposited. That is, as explained above, the reason why nickel (metal) layer patterns are defined using photoresist in the present invention is to prevent reaction between nickel (metal) and amorphous silicon.

Figure 3E:
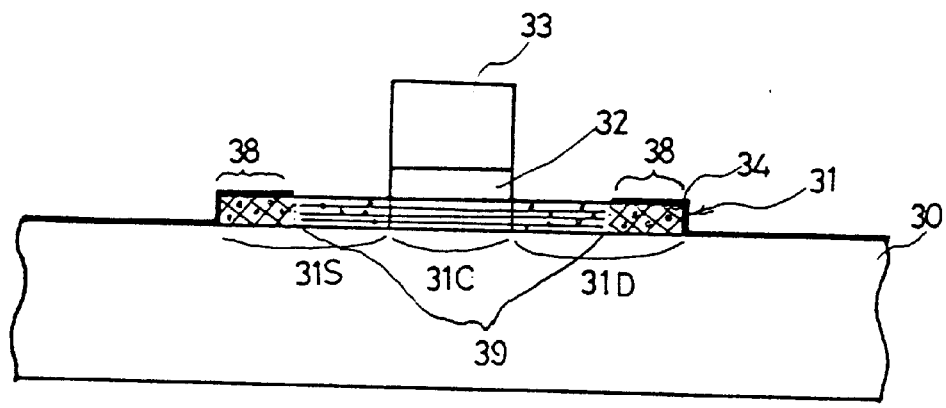

Referring to FIG. 3E, the formed structure is thermally heated in a furnace at a temperature of 300 to 500° C. wherein crystallization of amorphous silicon proceeds. During the process of crystallizing amorphous silicon, portions of the active layer 31 having the nickel layer 34 thereon are crystallized by MIC, while nickel off-set and channel regions 37 and 31C are crystallized by MILC. Hence, the portion having nickel thereon in portions of the source/drain region 31S and 31D becomes an MIC region 39, and the channel region 31C (nickel off-set region) and portions of the source/drain region 31S and 31D become an MILC region 39.

The boundaries between the MIC and MILC regions 38 and 39 are located outside the channel region, for example, within the source and drain regions 31S and 31D. The crystalline structure of silicon near such junctions (boundaries) is homogeneous. Thus, compared to the conventional art, traps caused by the changed crystalline structure of silicon near the junctions are prevented.

FIGS. 4A–4D show a method of fabricating an MILC TFT according to a second embodiment of the present invention.

Figure 4A:
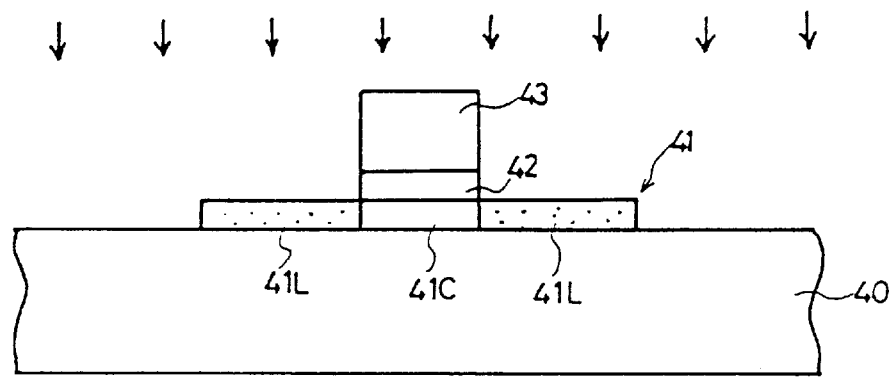
FIGS. 4A–4D show a method of fabricating an MILC TFT according to a second embodiment of the present invention.

Referring to FIG. 4A, an active layer 41 is formed by depositing amorphous silicon on an insulation substrate 40. A gate insulating layer 41 and a gate electrode 43 are formed on the active layer 41. The active layer 41 is lightly doped with impurities by applying a lightly doping process on the entire surface of the formed structure wherein the gate electrode 43 functions as a doping mask against dopants. Reference numeral 41L denotes a lightly doped region in the active layer 41 and 41C denotes a channel region of the TFT.

Figure 4B:
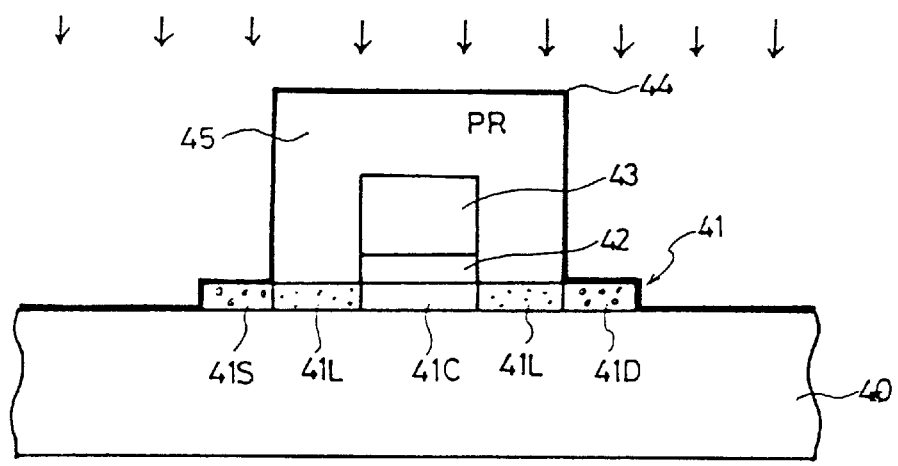

Referring to FIG. 4B, a photoresist pattern 45 is defined by patterning photoresist PR coated on the entire surface of the substrate using photolithography. Here, the photoresist pattern 45 extends farther than the gate electrode 43 by preferably about 0.02 to 10 μm but other suitable dimensions can be used. A metal layer, such as a nickel layer 44, is formed to a thickness of about 20 to 200 Å by sputtering. Then a source region 41S and a drain region 41D are formed by doping heavily portions of the lightly doped regions 41L of the active layer 41 using the photoresist pattern 45 as a mask.

Figure 4C:
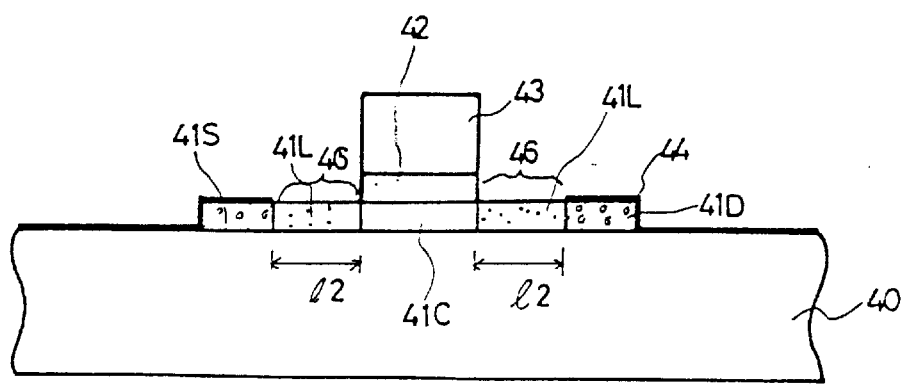
Figure 4D:
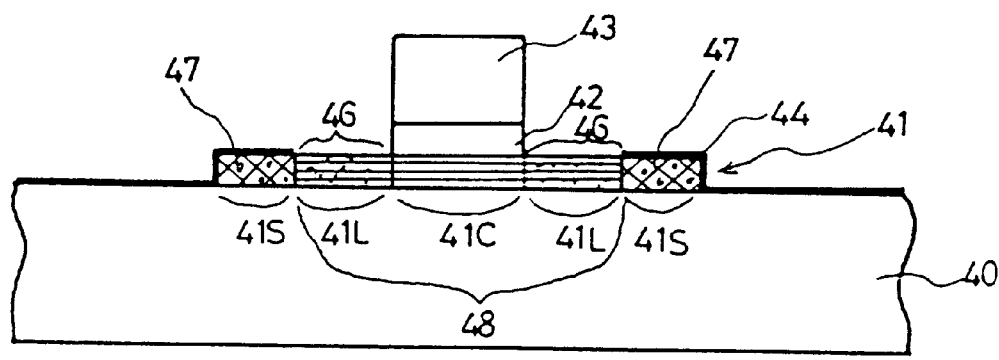

Referring to FIG. 4C, the photoresist pattern 45 is removed by a LIFT-OFF process. This forms nickel off-set regions 46 each having a length "$l_2$" of preferably about 0.01 to 5 μm. Portions of the nickel layer 44 still remain over the source and drain regions 41S and 41D and on portions of the substrate 40.

Referring to 4D, amorphous silicon is crystallized when the substrate is heated under the temperature of 300 to 500° C. in a furnace. A part of the active layer 41 having the nickel layer 44 thereon is crystallized by MIC, whereas the nickel off-set regions 46 and the channel region 41C are crystallized by MILC. Hence, the source/drain regions 41S and 41D become MIC regions 47, and the channel and lightly doped regions 41C and 41L become MILC regions 48. The activation and crystallization of the impurity proceeds in the source and drain regions 41S and 41D.

In the second embodiment of the present invention, the boundaries between the MIC and MILC regions having different crystal structures are located outside the channel region 41C. Thus the silicon structures near such junctions are the same or substantially the same. This eliminates traps caused by the change in the crystalline structure.

If the lightly doping step described referring to FIG. 4A is skipped but the subsequent steps described referring to FIGS. 4B–4C are performed, the lightly doped regions 41L become impurity off-set regions having no dopant therein. A thin film transistor fabricated by this modified method also prevents formation of traps.

FIGS. 5A–5D show a method of fabricating an MILC TFT according to a third embodiment of the present invention.

Figure 5A:
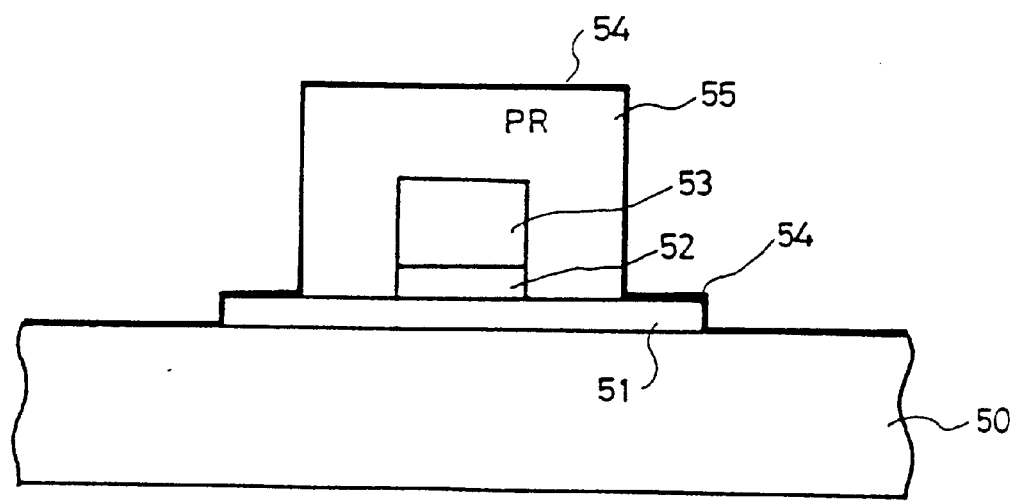
FIGS. 5A–5D show a method of fabricating an MILC TFT according to a third embodiment of the present invention.

Referring to FIG. 5A, an active layer 51 is formed on an insulation substrate 50 by depositing and patterning amorphous silicon. A gate insulating layer 52 and a gate electrode 53 are formed on the active layer 51. A photoresist pattern 55 extending beyond the gate electrode 53 by preferably about 0.02 to 10 μm is formed by patterning photoresist PR coated on the entire surface of the substrate 50. Over the formed structure, a metal layer, such as a nickel layer 54, is formed to a thickness of 20 to 200 Å by sputtering nickel.

Figure 5B:
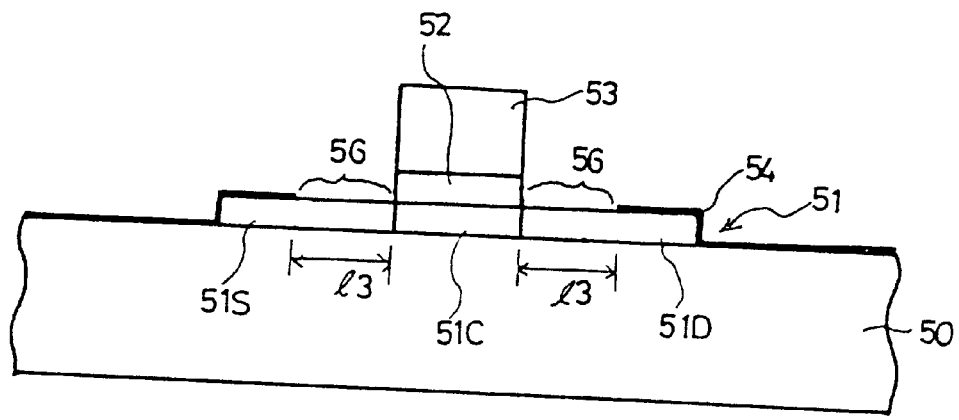

Referring to FIG. 5B, nickel off-set regions 56 are formed at certain portions of the active layer 51 by removing the photoresist pattern 55 by a LIFT-OFF process through which portions of the nickel layer 54 covering the surface of the photoresist pattern PR are also removed. The length "$l_3$" of each nickel off-set region 56 is preferably about 0.01 to 5 μm since the photoresist pattern 55 extends more than the gate electrode 52 by about 0.02 to 10 μm.

Figure 5C:
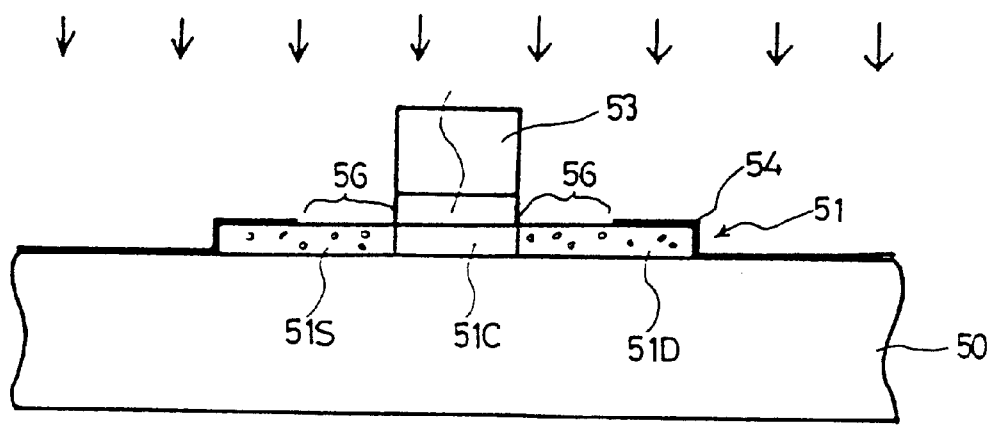

Referring to FIG. 5C, source and drain regions 51S and 51D are formed in the active layer 51 by doping heavily the entire surface of the formed structure with impurities. The gate electrode 53 functions as a blocking mask in this doping step. The impurities pass through the thin nickel layer 54 and reach the silicon layer 51. Reference numeral 51C denotes a channel region of the transistor.

Figure 5D:
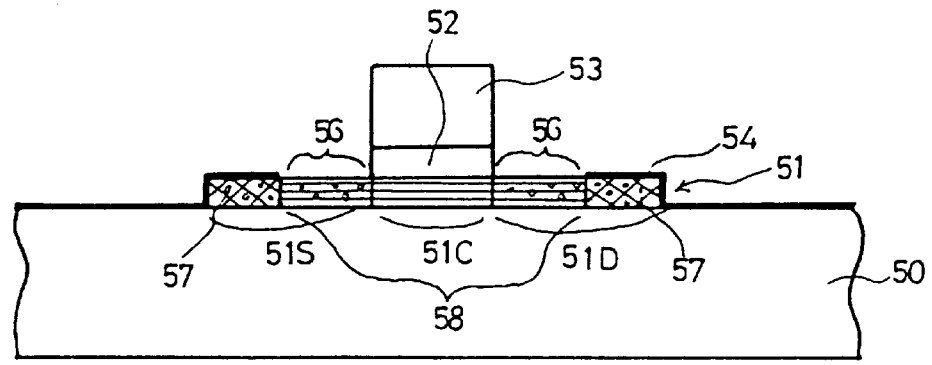

Referring to FIG. 5D, amorphous silicon of the active layer 51 is crystallized when the formed structure is heated in a furnace at a temperature of 300 to 500° C. In the process of crystallizing amorphous silicon, the amorphous silicon in the active layer 51 having the nickel layer 54 thereon is crystallized by MIC to form MIC regions 57, and the nickel off-set regions 56 having no nickel layer 54 thereon are crystallized by MILC to form MILC regions 58. In other words, portions of the source and drain regions 51S and 51D with the nickel layer 54 thereon are crystallized by the MIC process, whereas the channel region 51C and the nickel off-set regions 56 in the source and drain regions 51S and 51D (i.e., with no nickel layer 54) are crystallized by the MILC process.

FIGS. 6A–6D show a method of fabricating an MILC TFT according to a fourth embodiment of the present invention.

Figure 6A:
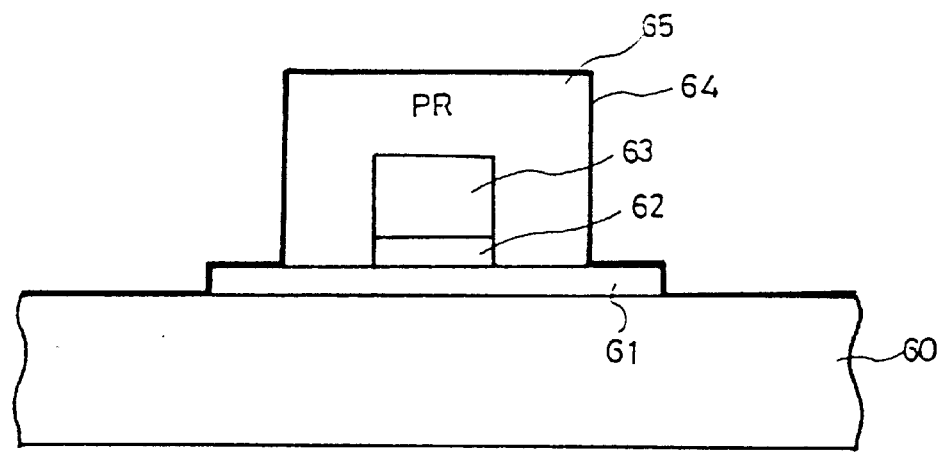
FIGS. 6A–6D show a method of fabricating an MILC TFT according to a fourth embodiment of the present invention.

Referring to FIG. 6A, an active layer 61 is formed on an insulation substrate 60 by depositing and patterning amorphous silicon. Then a gate insulating layer 62 and a gate electrode 63 are formed on the active layer 61. A photoresist pattern 65 extending more than the gate electrode 63 by preferably about 0.02 to 10 $\mu$m is formed by patterning photoresist PR coated on the entire surface of the formed structure. A metal layer, such as a nickel layer 64, is then formed to a thickness of about 20 to 200 Å by sputtering nickel on the formed structure.

Figure 6B:
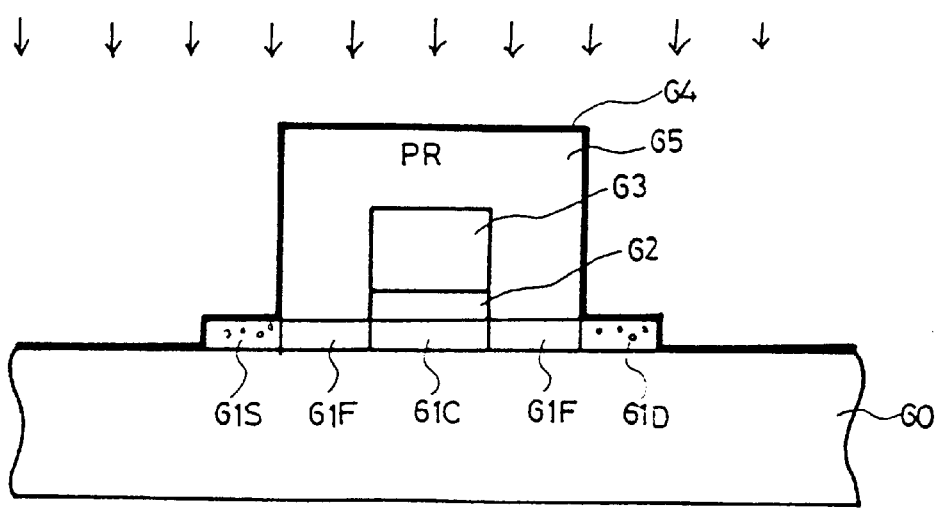

Referring to FIG. 6B, source and drain regions 61S and 61D are formed within the active layer 61 by doping heavily the entire surface of the formed structure with impurities, using the photoresist pattern 65 as a blocking mask. The impurities pass through the thin nickel layer 64 and reach end portions of the silicon layer 61. Reference numerals 61C and 61F denote a channel region and doping off-set regions protected from the impurities by the photoresist pattern 65, respectively.

Figure 6C:
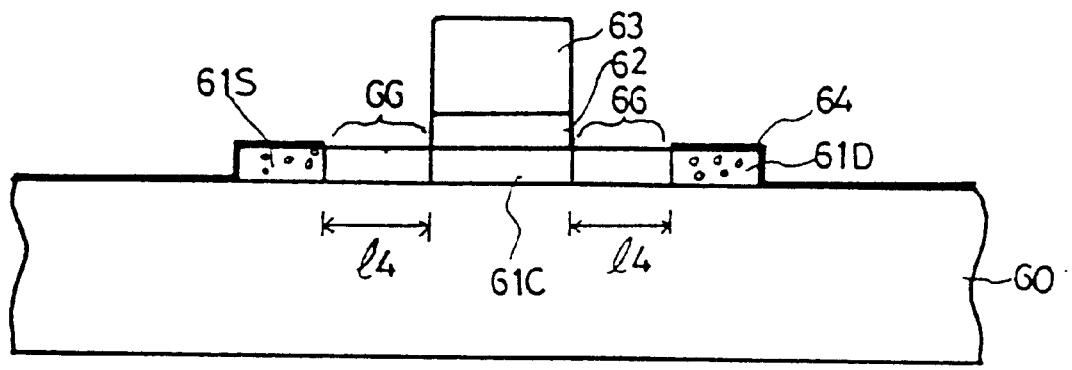

Referring to FIG. 6C, nickel off-set regions 66 are formed on portions of the active layer by removing the photoresist pattern 65 using a LIFT-OFF process through which portions of the nickel layer 64 covering the surface of the photoresist pattern 65 is also removed. This creates nickel off-set regions 66, which are the doping off-set regions without the nickel layer 64 formed thereon. The length "$l_4$" of each nickel off-set region 66 ranges from 0.01 to 5 $\mu$m since the photoresist pattern PR is longer than the gate by 0.02 to 10 $\mu$m.

Figure 6D:
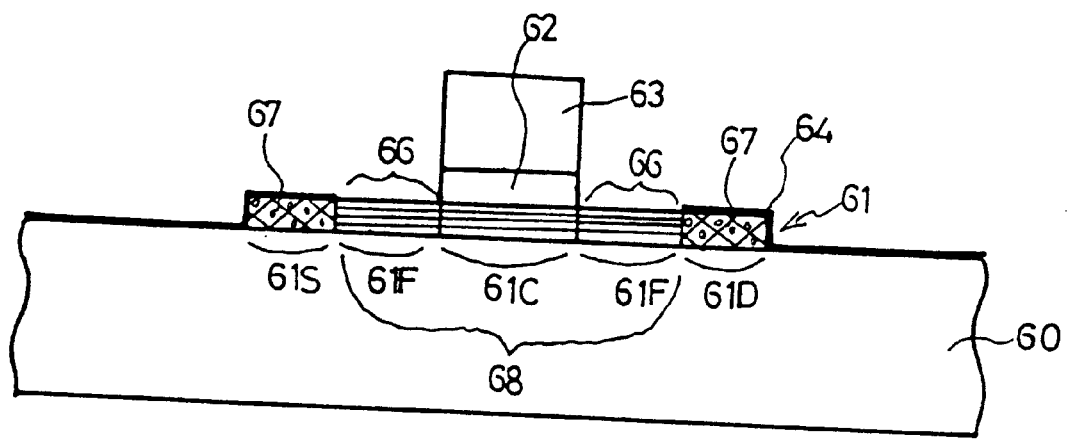

Referring to FIG. 6D, amorphous silicon is crystallized when the formed structure is heated in a furnace at a temperature of about 300 to 500° C. In the process of crystallizing the amorphous silicon, the amorphous silicon in the active layer 61 having the nickel layer 64 thereon is crystallized by MIC to form MIC regions 67, and the nickel off-set regions 66 having no nickel layer 64 thereon are crystallized by MILC to form MILC regions 68. In other words, portions of the source and drain regions 61S and 61D having the nickel layer 64 thereon are crystallized by the MIC process, whereas the channel region 61C and the doping off-set regions 61F having no nickel layer 64 are crystallized by the MILC process.

The boundaries between the MIC and MILC regions are placed outside the channel region in the third and fourth embodiments as in the first and second embodiments. Thus the crystalline structure of silicon near such junctions is homogeneous. Compared to the conventional art, traps caused by the changed crystalline structure of silicon near the junctions are then diminished or eliminated.

Figure 7:
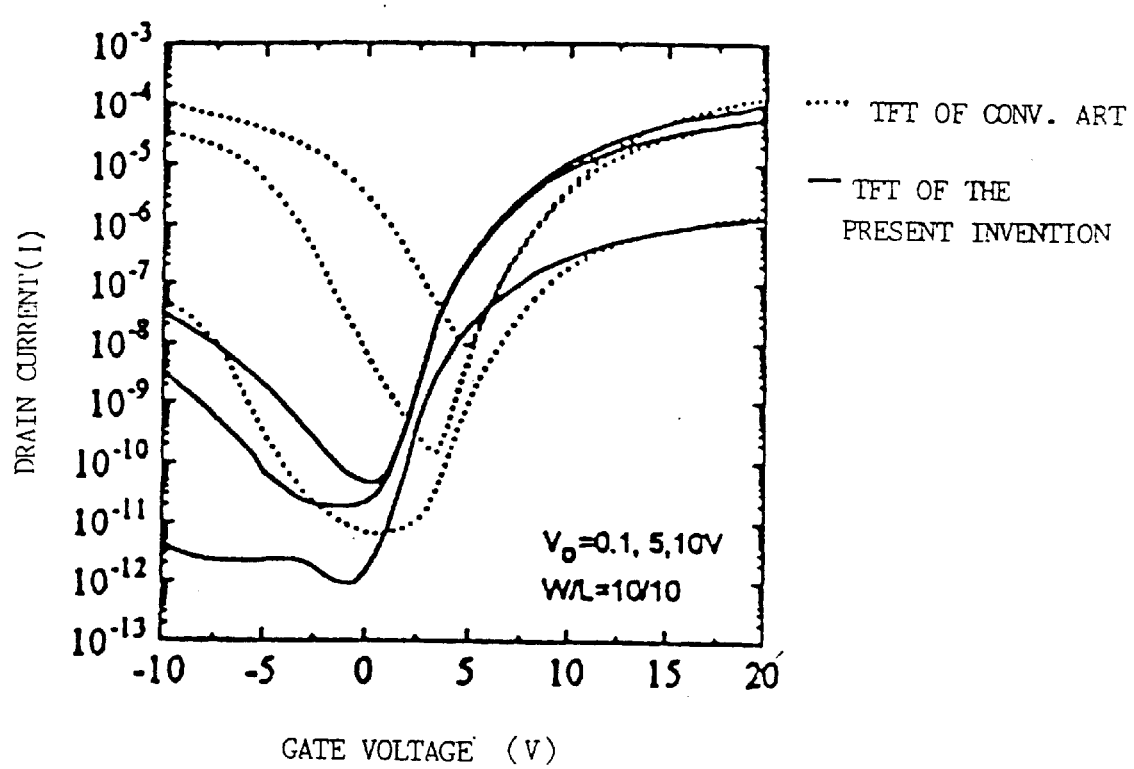
FIG. 7 shows a graph showing a relation between a drain current and a gate voltage for TFTs according to a related art and to the present invention.

FIG. 7 shows a graph comparing the characteristics of TFTs according to the conventional art with the characteristics of TFTs according to the present invention. This exemplary graph shows a relationship between drain current I and gate voltage V of the conventional TFT and of a TFT fabricated according to the present invention. According to the graph, the present invention TFT, as a sample, has been processed with heat treatment at a low temperature of under 500° C. for 15 hours wherein the W/L (width/length of channel region) ratio is 10 $\mu$m/10 $\mu$m. The length of a nickel off-set region of a TFT of the present invention used in the experiment is about 2.5 $\mu$m.

As shown in the experiment, the TFT fabricated by the present invention has less leakage current than the conventional TFT made by MILC in cases where drain voltages VD are such as 0.1, 5, and 10 V. Specially, the on/off ratio of the leakage current is relatively high at the drain voltage of 10 V.

Figure 8:
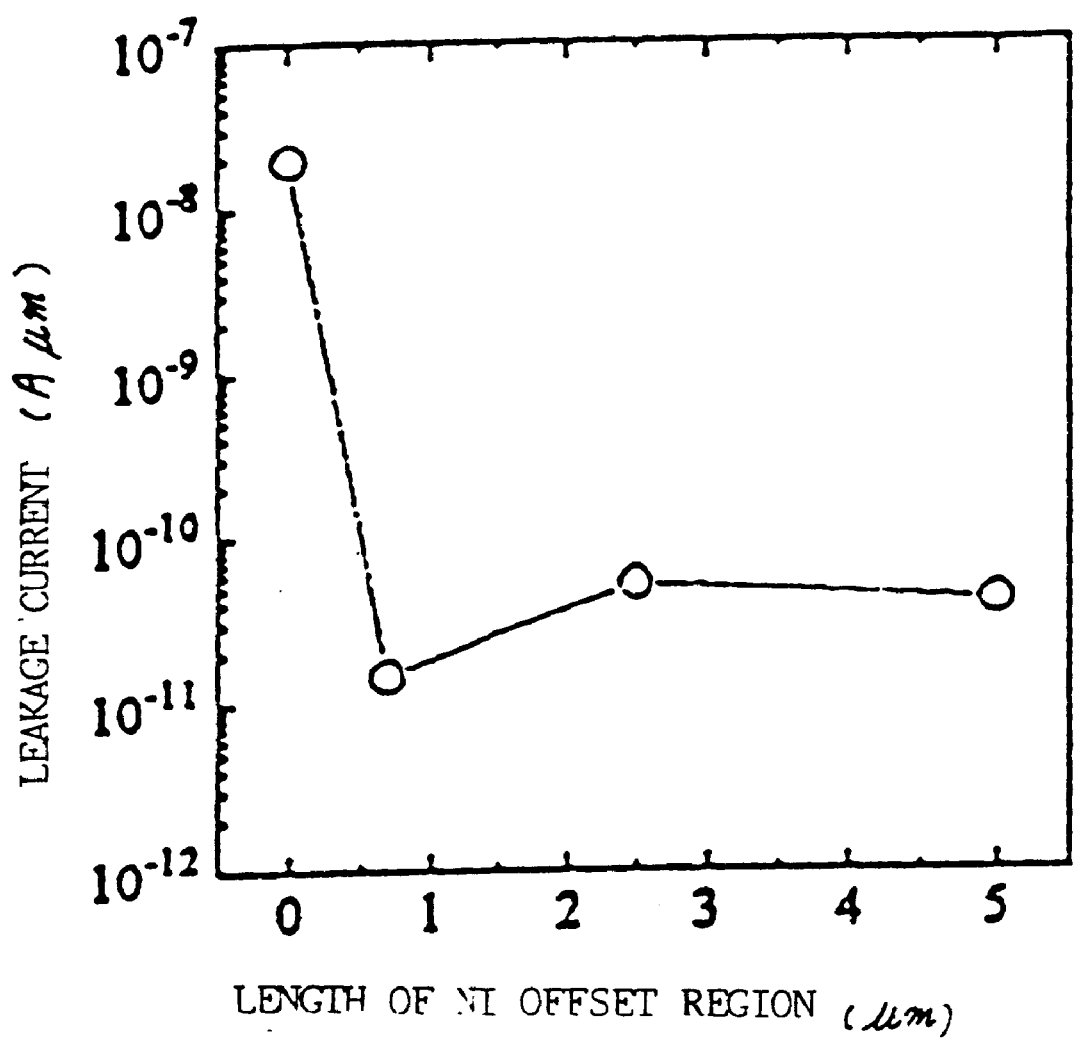
FIG. 8 shows a graph showing a relation between leakage current and the length of a nickel off-set region according to the present invention.

FIG. 8 shows characteristic changes of leakage current based on the length of a nickel off-set region where the gate voltage and the drain voltage of the TFT according to the present invention are set at 0 V and 15 V, respectively.

As shown in FIG. 8, the leakage current values are low where the length of the nickel off-set region is between 0.01 and 5 $\mu$m. For example, the value of leakage current decreases substantially as the length of the nickel (NI) off-set region increases from 0.0 to 0.7 $\mu$m.

Hence, the leakage current is decreased by controlling the length of the nickel off-set regions of the TFT according to the invention.

The boundaries between the MIC and MILC regions are placed outside the channel region in the third and fourth embodiments as in the first and second embodiments. Thus the crystalline structure of silicon near such junctions is homogeneous. Compared to a conventional art, traps caused by the changed crystalline structure of silicon near the junctions are then diminished or eliminated.

FIGS. 9A–9F show a method of fabricating MILC TFTs and an amorphous silicon TFT according to a fifth embodiment of the present invention In an LCD, transistors for driving circuits should have high mobility and transistors for pixel array should have low leakage current. In general, polycrystalline silicon TFTs have higher mobility and higher leakage current than amorphous silicon TFTs. Polycrystalline silicon TFTs fabricated by using MILC shows such same characteristics. Accordingly, it is desirable to place polycrystalline silicon TFT in driving circuit region and amorphous silicon TFTs in pixel array regions.

However, it is difficult, if not impossible, to form polycrystalline silicon TFT and amorphous silicon TFT on the one substrate simultaneously using a Solid Phase Crystallization technique.

It is also difficult to form polycrystalline silicon TFT and amorphous silicon TFT on one substrate simultaneously using a laser annealing technique because selective regions (which will become polycrystalline silicon) of the amorphous silicon layer are laser—irradiated.

In using the MILC technique, the amorphous silicon layer can be crystallized below 500° C. with the aid of a thin metal layer, such as Ni, which functions as a catalyst for crystallization. The amorphous silicon layer can not be crystallized below 500° C. without a catalyst.

Henceforth, one type of transistors for the driving circuit will be referred as a "first transistor", another type of transistors for the driving circuit will be referred as a "second transistor," and a type of transistors for the pixel array will be referred as a "third transistor."

Referring to FIG. 9A, an active layer of the first transistor 91, an active layer of the second transistor 92 and an active layer of the third transistor 93 are formed on an insulation substrate 900 by depositing and patterning an amorphous silicon layer. Then, gate insulating layers 94-1, 94-2 and 94-3 and gate electrodes 95-1, 95-2 and 95-3 are formed on the active layers 91, 92 and 93, respectively.

Referring to FIG. 9B, a photoresist pattern PR is formed by patterning a photoresist coated on the entire surface of the substrate. Here, the photoresist pattern PR covers more than the gate electrode of the first transistor 95-1 and the gate electrode of the second transistor 95-2 preferably by 0.02 to 10 μm. The photoresist pattern PR preferably covers the third transistor in its entirety.

Figure 9C:
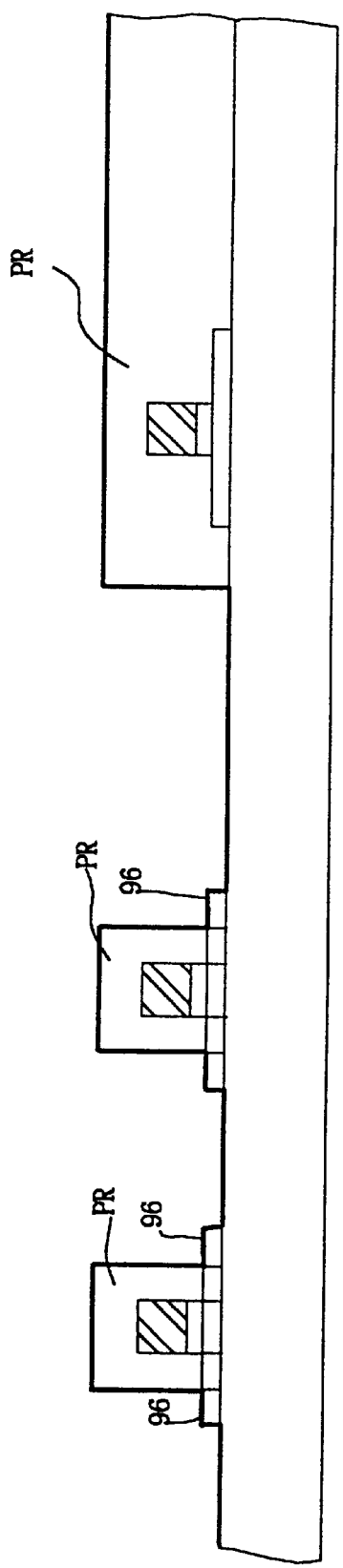

Referring to FIG. 9C, a metal layer 96, such as a nickel layer, is then formed to a thickness of preferably 20 to 200 Å by sputtering nickel on the formed structure.

Alternatively, nickel may be substituted with a suitable metal such as Pd, Ti, Ag, Au, Al, Sb, Cu, Co, Cr, Mo, Ti, Ir, Ru, Rh, Cd, and Pt, and their mixture.

Figure 9D:
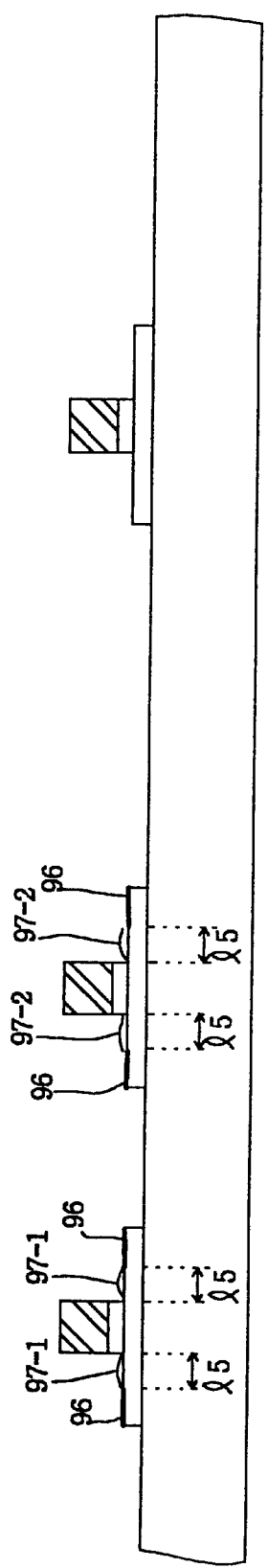

Referring to FIG. 9D, nickel off-set regions 97-1 and 97-2 are formed on the portions of the active layer of the first transistor 91 and the active layer of the second transistor 92, respectively, by removing the photoresist pattern PR using a LIFT-OFF process through which portions of the nickel layer 96 on the surface of the photoresist pattern PR are also removed.

The length "$l_5$" of each nickel off-set regions 97-1 and 97-2 ranges preferably from 0.01 to 5 μm since the photoresist pattern PR is longer than the gate by about 0.02 to 10 μm.

Herein, the third transistor is exposed as shown in FIG. 9D.

Referring to FIG. 9E, source and drain regions 91S and 91D of the first transistor, source and drain regions 92S and 92D of the second transistor, and source and drain regions 93S and 93D of the third transistor are formed within the exposed active layers 91, 92 and 93 by doping the entire surface of the formed structure with impurities.

In another method, the time of doping the active layers 91, 92 and 93 with impurities may be made after the process described referring to FIG. 9A, as discussed with reference to previous embodiments.

Referring to FIG. 9F, amorphous silicon is crystallized when the substrate is heated under the temperature of about 300 to 500° C. in a furnace. A part of the active layers of the first and the second transistors 91 and 92 having the nickel layer 96 thereon are crystallized by MIC, whereas the nickel off-set regions 97-1 and 97-2 and the channel region of the first and the second transistors are crystallized by MILC.

Here, the silicon layers crystallized by MIC are indicated by vertical lines and the silicon layers crystallized by MILC are indicated by horizontal lines. The activation of the impurities and crystallization proceed in the source and drain regions of the first and the second transistors.

While the activation of the impurities proceed in the source and the drain regions of the third transistor. The crystallization does not proceed in the source and the drain regions of the third transistor.

Accordingly, the active layers of the first and the second transistors become crystallized silicon layers 91' and 92' and the active layer of the third transistor 93 becomes non-crystallized silicon layer, amorphous silicon layer.

Figure 9G:
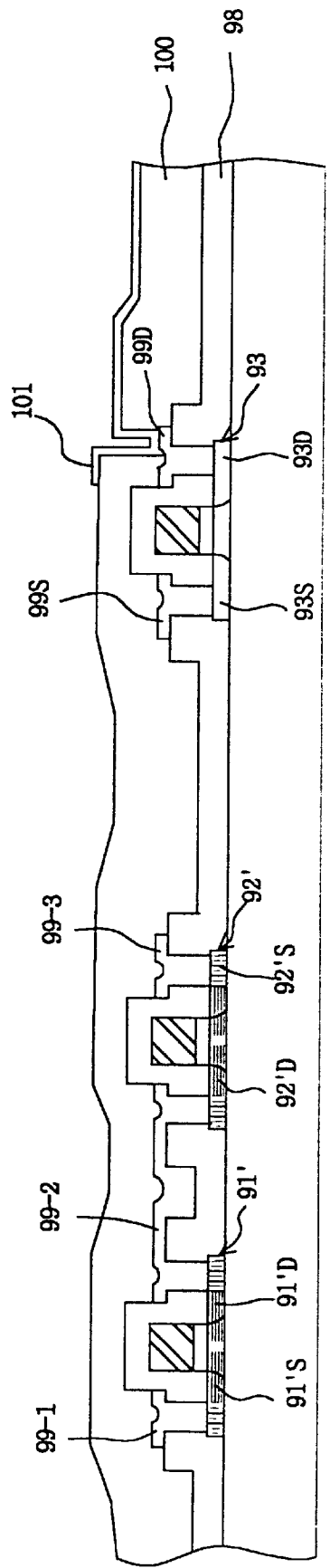

Referring to FIG. 9G, the manufacturing process is carried out to form the transistors for the driving circuit and pixel array on the same substrate.

An insulating interlayer 98 is formed on the surface of the exposed substrate. Then, contact holes for exposing each source region and drain region of the first, second and third transistors are formed in the insulating interlayer 98. Then, a first wire 99-1, a second wire 99-2 and a third wire 99-3 electrically connect the first transistor and the second transistor to form CMOS transistors. The source electrode 99S connecting the source region 93S and the drain electrode 99D connecting the drain region 93D are formed on the insulating interlayer 98.

A passivation layer 100 is formed on the surface of the exposed substrate having a contact hole for exposing the drain electrode 99D of the third transistor. Then, the pixel electrode 101 is formed to connect to the drain electrode 99D of the third transistor through the contact hole.

As shown in FIGS. 9A to 9G, polycrystalline silicon TFT for the driving circuit and amorphous silicon TFT for the pixel array can be formed on one substrate simultaneously through depositing thin metal layer in region where polycrystalline silicon TFT is to be formed and not depositing the thin metal layer in a region where amorphous silicon TFT is to be formed simultaneously and then performing thermal treatment.

In the present invention, traps caused in the junctions between the channel region and the source and drain regions are reduced or eliminated by having boundaries between MIC and MILC regions outside the channel region. This decreases the leakage current from the thin film transistor as well. Hence, the present invention provides a stable channel region and improves the characteristics of a thin film transistor.

Also, polycrystalline silicon TFT for the driving circuit and amorphous silicon TFT for the pixel array are formed on one substrate simultaneously.

It will be apparent to those skilled in the art that various modifications and variations can be made in thin film transistors and fabricating method of the present invention without departing from the spirit or scope of the inventions. Thus, it is intended that the present invention cover the modifications and variations of this invention provided they come within the scope of the appended claims and their equivalents.

What is claimed is:

1. A liquid crystal display comprising:
   a substrate having first, second and third regions;
   a first transistor on the first region of the substrate, the first transistor including:
      a first metal-induced lateral crystallization (MILC) region having a first channel region; and
      a first metal-induced crystallization (MIC) region adjacent the first MILC,
      wherein a boundary between the first MILC region and the first MIC region is located outside the first channel region;
   a second transistor on the second region of the substrate, the second transistor including:
      a second MILC region having a second channel region; and
      a second MIC region adjacent the second MILC region, wherein a boundary between the second MILC region and the second MIC region is located outside the second channel region; and
   a third transistor on the third region of the substrate.

2. The liquid crystal display according to claim 1, wherein the substrate includes a glass substrate having a driver circuit region and a pixel region, the first transistor, second transistor, and third transistor being on the glass substrate, the first and second transistors being part of the driver circuit region and the third transistor being part of the pixel region.

3. The liquid crystal display according to claim 1, wherein the third transistor includes an active layer made of amorphous silicon.

4. The liquid crystal display according to claim 1, wherein the third transistor includes an active layer made of polysilicon.

5. The liquid crystal display according to claim 1, wherein the third transistor includes:

a third MILC region having a third channel region; and a third MIC region adjacent the third MILC region, wherein a boundary between the third MILC region and the third MIC region is located outside the third channel region.

6. The liquid crystal display according to claim 1, wherein the first and second transistors are part of a CMOS transistor unit for a driver circuit of the liquid crystal display.

7. The liquid crystal display according to claim 1, wherein the first MILC region of the first transistor includes side portions at sides of the first channel region.

8. The liquid crystal display according to claim 7, wherein at least one of the side portions has a length of about 0.01 to 5.0 µm.

9. The liquid crystal display according to claim 1, wherein the first MILC region includes a portion of source and drain regions of the first transistor.

10. The liquid crystal display according to claim 1, wherein at least one of the first and second transistors has a polysilicon channel region and one of a lightly doped drain (LDD) and offset region.

11. The liquid crystal display according to claim 10, wherein the third transistor has an amorphous silicon channel region.

12. The liquid crystal display according to claim 11, wherein the third transistor has one of an LDD or offset region.

13. The liquid crystal display according to claim 10, wherein the third transistor has a polysilicon channel region.

14. The liquid crystal display according to claim 13, wherein the third transistor has one of an LDD or offset region.

15. The liquid crystal display according to claim 1, wherein the third transistor has an amorphous silicon channel region.

16. The liquid crystal display according to claim 15, wherein the third transistor has one of an LDD or offset region.

17. The liquid crystal display according to claim 1, wherein the third transistor has a polysilicon channel region.

18. The liquid crystal display according to claim 17, wherein the third transistor has one of an LDD or offset region.

* * * * *